United States Patent
Liang et al.

(10) Patent No.: US 9,223,648 B2
(45) Date of Patent: Dec. 29, 2015

(54) MEMORY STORAGE DEVICE, MEMORY CONTROLLER THEREOF, AND METHOD FOR PROCESSING DATA THEREOF

(71) Applicant: PHISON ELECTRONICS CORP., Miaoli (TW)

(72) Inventors: Li-Chun Liang, Kaohsiung (TW); Tien-Ching Wang, Kaohsiung (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 121 days.

(21) Appl. No.: 13/662,541

(22) Filed: Oct. 28, 2012

(65) Prior Publication Data
US 2014/0047300 A1 Feb. 13, 2014

(30) Foreign Application Priority Data
Aug. 8, 2012 (TW) ............................. 101128618 A

(51) Int. Cl.
| | |
|---|---|
| G11C 29/00 | (2006.01) |
| G06F 11/10 | (2006.01) |
| H03M 13/27 | (2006.01) |
| H03M 13/29 | (2006.01) |
| H03M 13/11 | (2006.01) |
| H03M 13/15 | (2006.01) |
| H03M 13/19 | (2006.01) |

(52) U.S. Cl.
CPC ......... *G06F 11/1044* (2013.01); *H03M 13/271* (2013.01); *H03M 13/2778* (2013.01); *H03M 13/2906* (2013.01); *H03M 13/1102* (2013.01); *H03M 13/1515* (2013.01); *H03M 13/19* (2013.01)

(58) Field of Classification Search
CPC ............ G06F 11/1008; G06F 11/1076; G06F 11/1068; G06F 11/1044; G11C 7/1006; G11B 20/1833; H03M 13/13; H03M 13/271; H03M 13/2778; H03M 13/19; H03M 13/1515; H03M 13/1102; H03M 13/2906
USPC .................. 714/752, 763, 766, 710, 718, 753
See application file for complete search history.

(56) References Cited

U.S. PATENT DOCUMENTS

| | | | | |
|---|---|---|---|---|
| 5,724,391 | A * | 3/1998 | Takeuchi et al. | 375/240 |
| 6,453,439 | B1 * | 9/2002 | Hattori et al. | 714/755 |
| 7,330,995 | B2 * | 2/2008 | Shiraishi et al. | 714/2 |

(Continued)

OTHER PUBLICATIONS

"Office Action of Taiwan Counterpart Application", issued on Feb. 11, 2015, p. 1-p. 12.

*Primary Examiner* — Albert Decady
*Assistant Examiner* — Osman Alshack
(74) *Attorney, Agent, or Firm* — Jianq Chyun IP Office

(57) ABSTRACT

A data processing method adapted for a rewritable non-volatile memory module is provided. The method includes receiving a first data stream and performing an error-correction encoding procedure on the first data stream to generate an original error checking and correcting (ECC) code corresponding to the first data stream. The method also includes converting the original ECC code into a second ECC code according to a second rearrangement rule, and the original ECC code is different from the second ECC code. The method further includes respectively writing the first data stream and the second ECC code into a data bit area and an error-correction code bit area of the same or different physical programming units in the rewritable non-volatile memory module.

19 Claims, 13 Drawing Sheets

(56) References Cited

U.S. PATENT DOCUMENTS

| | | | |
|---|---|---|---|
| 7,350,133 B2* | 3/2008 | Kim et al. | 714/762 |
| 2002/0023247 A1* | 2/2002 | Akiyama et al. | 714/758 |
| 2002/0129313 A1* | 9/2002 | Kubo et al. | 714/752 |
| 2002/0199150 A1* | 12/2002 | Holman | 714/755 |
| 2004/0057299 A1 | 3/2004 | Kozakai et al. | |
| 2004/0133836 A1* | 7/2004 | Williams | 714/746 |
| 2006/0218464 A1* | 9/2006 | Hwang et al. | 714/758 |
| 2007/0011581 A1* | 1/2007 | Nakanishi et al. | 714/768 |
| 2008/0092009 A1* | 4/2008 | Miyata et al. | 714/755 |
| 2008/0288852 A1* | 11/2008 | Uehara et al. | 714/786 |
| 2010/0088574 A1 | 4/2010 | Kim et al. | |
| 2010/0211857 A1* | 8/2010 | Kobayashi | 714/784 |
| 2010/0281340 A1* | 11/2010 | Franceschini et al. | 714/763 |
| 2011/0010604 A1* | 1/2011 | Hwang et al. | 714/755 |
| 2011/0153913 A1* | 6/2011 | Huang et al. | 711/103 |
| 2011/0185105 A1* | 7/2011 | Yano et al. | 711/103 |
| 2012/0084622 A1* | 4/2012 | D'Abreu et al. | 714/755 |
| 2013/0091404 A1* | 4/2013 | Ootsuka | 714/763 |

* cited by examiner

MEMORY STORAGE DEVICE, MEMORY CONTROLLER THEREOF, AND METHOD FOR PROCESSING DATA THEREOF

CROSS-REFERENCE TO RELATED APPLICATION

This application claims the priority benefit of Taiwan application serial no. 101128618, filed on Aug. 8, 2012. The entirety of the above-mentioned patent application is hereby incorporated by reference herein and made a part of this specification.

BACKGROUND OF THE INVENTION

1. Technology Field

The invention relates to a data processing method. More particularly, the invention relates to a method for processing an error checking and correcting (ECC) code of data, a memory storage device and a memory controller thereof using the method.

2. Description of Related Art

Digital cameras, cell phones, and MP3 players have undergone rapid growth in recent years, so that consumers' demands for storage media have also increased drastically. Since a rewritable non-volatile memory is characterized by data non-volatility, low power consumption, small volume, and non-mechanical structure, etc., the rewritable non-volatile memory is one of the most adaptable memories for battery-powered portable products. A solid state drive (SSD) is a storage device that employs a rewritable non-volatile memory as its storage medium. The rewritable non-volatile memory has been broadly used for storing important personal data thanks to its small volume and large capacity. Therefore, the rewritable non-volatile memory industry has played an important role in the electronic industry in recent years.

As error bits may occur in the data stored in a rewritable non-volatile memory due to various factors (for instance, memory cell leakages, program failures, damages, etc.), an error checking and correcting (ECC) circuit is usually configured in a memory storage system, and an ECC code is generated for the stored data to ensure the validity of the data. However, data containing error bits cannot be corrected if the number of the error bits in the data exceeds the number of error bits that can be detected and corrected by the ECC circuit. As a result, data loss may be caused.

At the time of reading data, if the read signal is interfered, the resultant data shift may disable certain ECC mechanisms from effectively detecting the error bits that cannot be corrected, and thereby incorrect detection results may be generated. Therefore, how to accurately detect the error bits is one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

The invention is directed to a data processing method, a memory controller, and a memory storage device capable of effectively detecting uncorrectable error bits while an error checking and correcting (ECC) procedure is performed.

In an exemplary embodiment of the invention, a method for processing data for a rewritable non-volatile memory module is provided. The rewritable non-volatile memory module has a plurality of physical programming units, and each of the physical programming units includes a data bit area and an error-correction code bit area. The method includes receiving a first data stream and performing an error-correction encoding procedure on the first data stream to generate an original error checking and correcting (ECC) code corresponding to the first data stream. The method also includes converting the original ECC code into a second ECC code according to a second rearrangement rule. Here, the original ECC code is different from the second ECC code. The method further includes respectively writing the first data stream and the second ECC code into the data bit area and the error-correction code bit area in the same or different physical programming units.

From another perspective, in an exemplary embodiment of the invention, a memory controller for managing a rewritable non-volatile memory module is provided, and the memory controller includes a host system interface, a memory interface, an ECC circuit, a second rearrangement circuit, and a memory management circuit. The host system interface is configured to electrically connect the host system. The memory interface is configured to electrically connect the rewritable non-volatile memory module. Here, the rewritable non-volatile memory module has a plurality of physical programming units, and each of the physical programming units includes a data bit area and an error-correction code bit area. The ECC circuit is configured to perform an error-correction encoding procedure and an error-correction decoding procedure corresponding to each other. The second rearrangement circuit is electrically connected to the ECC circuit. The memory management circuit is electrically connected to the host system interface, the memory interface, the ECC circuit, and the second rearrangement circuit. Here, the ECC circuit performs the error-correction encoding procedure on the first data stream received by the memory controller, so as to generate an original ECC code corresponding to the first data stream. The second rearrangement circuit is configured to convert the original ECC code into a second ECC code according to a second rearrangement rule, and the original ECC code is different from the second ECC code. The memory management circuit respectively writes the first data stream and the second ECC code into the data bit area and the error-correction code bit area in the same or different physical programming units.

From another perspective, in an exemplary embodiment of the invention, a memory storage device that includes a rewritable non-volatile memory module, a connector, and a memory controller is provided. The rewritable non-volatile memory module has a plurality of physical programming units, and each of the physical programming units includes a data bit area and an error-correction code bit area. The connector is configured to electrically connect the host system. The memory controller is electrically connected to the rewritable non-volatile memory module and the connector for receiving a first data stream and performing an error-correction encoding procedure on the first data stream to generate an original ECC code corresponding to the first data stream. The memory controller is also configured to convert the original ECC code into a second ECC code according to a second rearrangement rule, and the original ECC code is different from the second ECC code. The memory controller is further configured to respectively write the first data stream and the second ECC code into the data bit area and the error-correction code bit area in the same or different physical programming units.

From another perspective, in an exemplary embodiment of the invention, a memory controller that includes a buffer memory, an error-correction encoding circuit, a first rearrangement circuit, a second rearrangement circuit, an error-correction decoding circuit, and a control unit is provided. The error-correction encoding circuit is configured to perform an error-correction encoding procedure on a first data stream to generate an original ECC code corresponding to the first data stream. The first rearrangement circuit is electrically connected to the buffer memory, the error-correction encoding circuit, and a rewritable non-volatile memory module. Here, the first rearrangement circuit is configured to convert an original written data stream from the buffer memory into the first data stream according to a first rearrangement rule, and the first data stream is different from the original written data stream. The second rearrangement circuit is electrically connected to the error-correction encoding circuit and the rewritable non-volatile memory module. Here, the second rearrangement circuit is configured to convert the original ECC code from the error-correction encoding circuit into a second ECC code according to a second rearrangement rule and re-convert the second ECC code from the rewritable non-volatile memory module into the original ECC code. Here, the second ECC code is different from the original ECC code, and the first rearrangement rule is different from the second rearrangement rule. The error-correction decoding circuit is electrically connected to the second rearrangement circuit and the rewritable non-volatile memory module. Here, the error-correction decoding circuit is configured to perform an error-correction decoding procedure corresponding to the error-correction encoding procedure on the first data stream from the rewritable non-volatile memory module according to the original ECC code, so as to recognize whether the first data stream has an uncorrectable error bit. The control unit is electrically connected to the buffer memory, the error-correction encoding circuit, the first rearrangement circuit, the second rearrangement circuit, the error-correction decoding circuit, and the rewritable non-volatile memory module.

In view of the above, before the data is written into the rewritable non-volatile memory module, the data is rearranged and converted into a different data, and an ECC code corresponding to the rearranged data is processed according to specific rules. Thereafter, the data and the ECC code rearranged and processed according to different rules are written into the rewritable non-volatile memory module. Thereby, when the data is to be read, the processed ECC code may be employed to accurately and effectively recognize whether the data has an uncorrectable error bit.

It should be understood, however, that this summary may not contain all of the aspects and embodiments of the invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF THE EMBODIMENTS

Figure 1A:
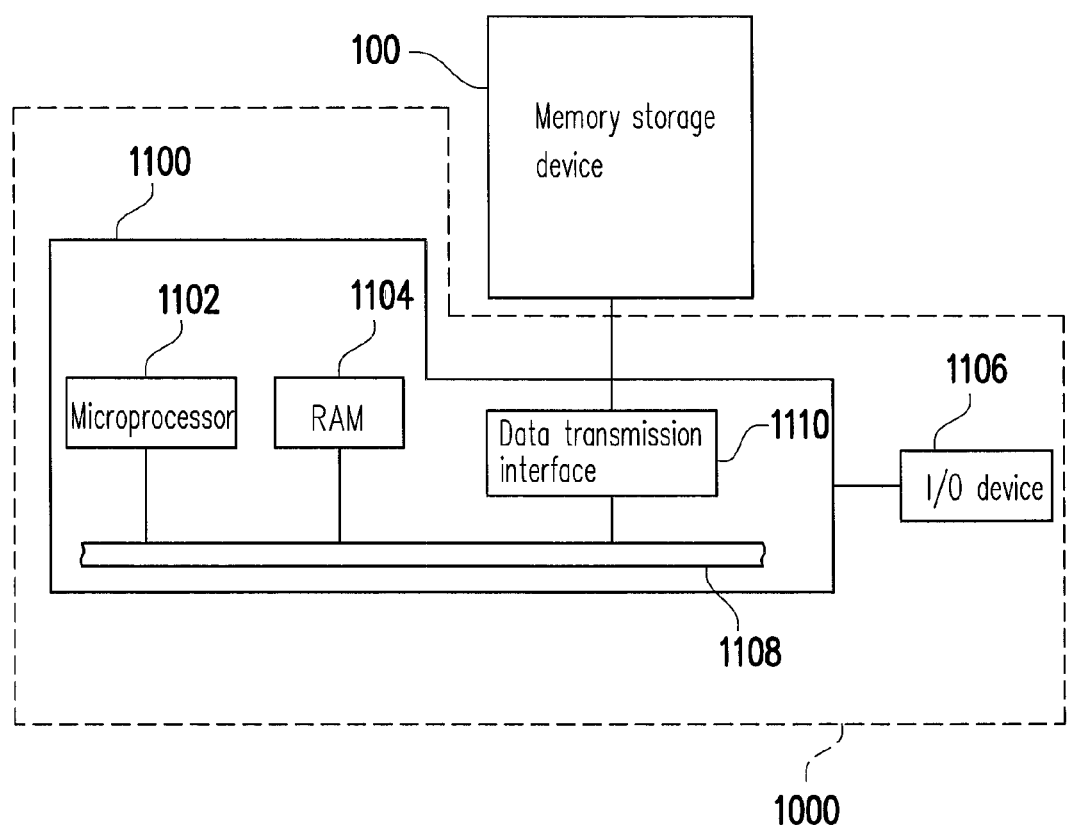
FIG. 1A is a schematic diagram illustrating a host system using a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (also referred to as a memory storage system) includes a rewritable non-volatile memory module and a controller (also referred to as a control circuit). The memory storage device is usually used together with a host system, such that the host system can write data into or read data from the memory storage device.

FIG. 1A is a schematic diagram illustrating a host system using a memory storage device according to an exemplary embodiment of the invention.

Figure 1B:
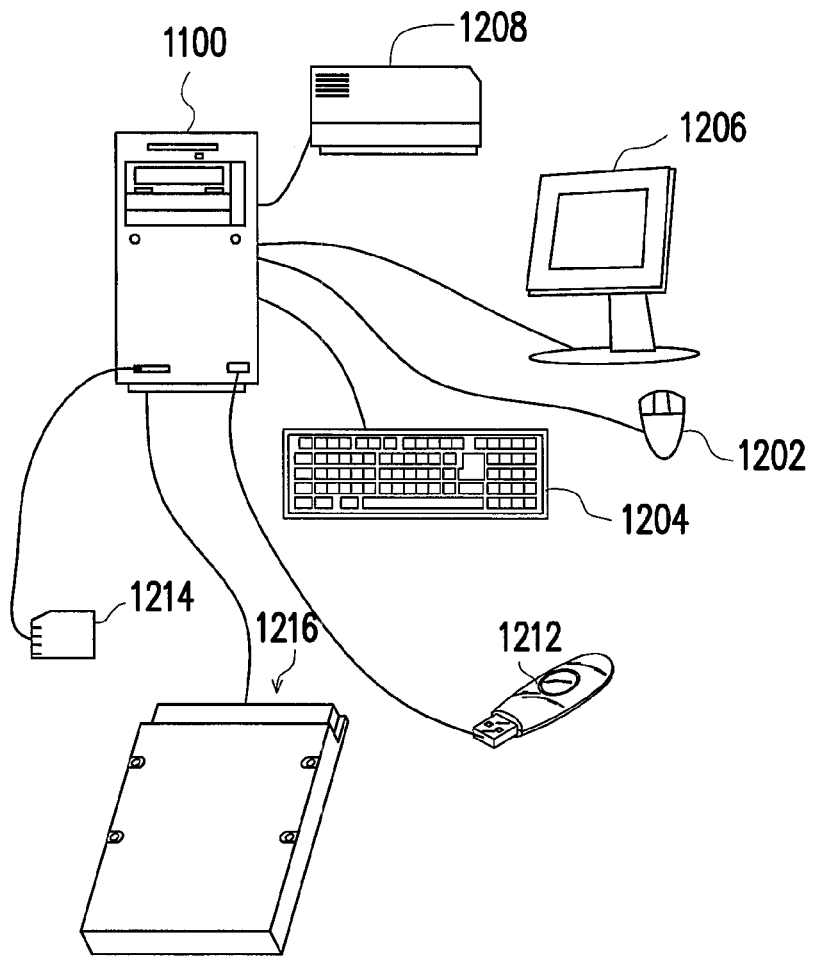
FIG. 1B is a schematic diagram illustrating a computer, an input/output (I/O) device, and a memory storage device according to an exemplary embodiment of the invention.

The host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 1B. It should be understood that the I/O device 1106 is not limited to the devices illustrated in FIG. 1B and may further include other devices.

In the present exemplary embodiment, the memory storage device 100 is electrically connected to the devices of the host system 1000 through the data transmission interface 1110. By using the microprocessor 1102, the RAM 1104 and the I/O device 1106, the host system 1000 may write the data into or read the data from the memory storage device 100. For instance, the memory storage device 100 may be a flash drive 1212, a memory card 1214, or a solid state drive (SSD) 1216, as shown in FIG. 1B.

Figure 1C:
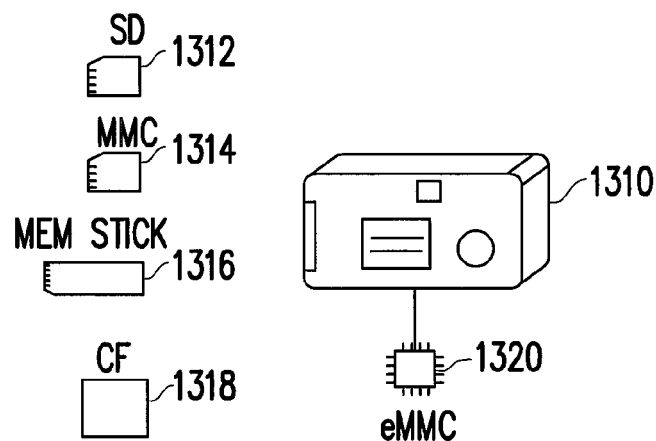
FIG. 1C is a schematic diagram illustrating a host system and a memory storage device according to another exemplary embodiment of the invention.

Generally speaking, the host system 1000 may be any system that can store data. Even though the host system 1000 is described as a computer system in the present exemplary embodiment, in another exemplary embodiment of the invention, the host system 1000 may also be a cell phone, a digital camera, a video camera, a communication device, an audio player, a video player, etc. For instance, when the host system is a digital camera 1310, the memory storage device is a secure digital (SD) card 1312, a multimedia card (MMC) 1314, a memory stick 1316, a compact flash (CF) card 1318, or an embedded storage device 1320 used by the digital camera 1310, as shown in FIG. 1C. The embedded storage device 1320 includes an embedded MMC (eMMC). It should be mentioned that the eMMC is directly electrically connected to the substrate of the host system.

Figure 2A:
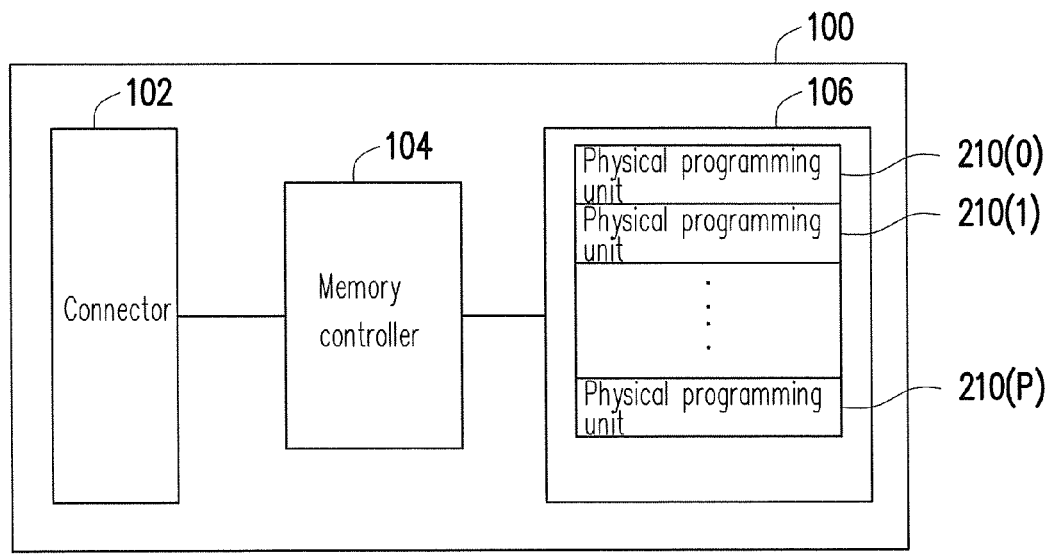
FIG. 2A is a schematic block diagram illustrating the memory storage device depicted in FIG. 1A.

FIG. 2A is a schematic block diagram illustrating the memory storage device 100 depicted in FIG. 1A. With reference to FIG. 2A, the memory storage device 100 includes a connector 102, a memory controller 104, and a rewritable non-volatile memory module 106.

The connector 102 is electrically connected to the memory controller 104 and is configured for electrically connecting the host system 1000. In the present exemplary embodiment, the transmission interface supported by the connector 102 is a serial advanced technology attachment (SATA) interface. However, in another exemplary embodiment, the transmission interface supported by the connector 102 may be a universal serial bus (USB) interface, an MMC interface, a parallel advanced technology attachment (PATA) interface, an institute of electrical and electronic engineers (IEEE) 1394 interface, a peripheral component interconnect (PCI) Express interface, an SD interface, an MS interface, a CF interface, an integrated drive electronics (IDE) interface, or any suitable interface which is not limited to the above.

The memory controller 104 executes a plurality of logic gates or control commands implemented in a hardware form or a firmware form and performs various data operations (e.g., data writing, reading, and erasing operations) in the rewritable non-volatile memory module 106 according to commands from the host system 1000. Here, the memory controller 104 further processes data to be written into the rewritable non-volatile memory module 106 by the host system 1000 according to the data processing method described in the present exemplary embodiment; based on the processing result, the memory controller 104 detects error bits at the time the host system 1000 reads the data. The data processing method described in the present exemplary embodiment will be explained hereinafter with reference to the drawings.

Figure 2B:
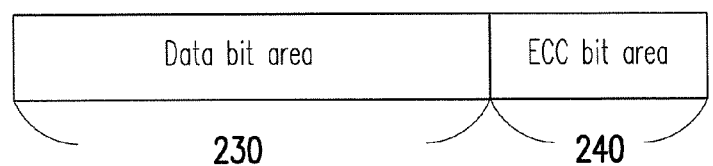
FIG. 2B is a schematic diagram illustrating a physical programming unit according to an exemplary embodiment of the invention.

The rewritable non-volatile memory module 106 is electrically connected to the memory controller 104. For instance, the rewritable non-volatile memory module 106 is a multi level cell (MLC) NAND flash memory module. However, the invention is not limited thereto, and the rewritable non-volatile memory module 106 may also be a single level cell (SLC) NAND flash memory module, any other flash memory module, or any other memory module having the same characteristics. To be specific, the rewritable non-volatile memory module 106 has a plurality of physical programming units 210(0)~210(P), each of which includes a data bit area 230 and an error-correction code bit area 240, as shown in FIG. 2B. The data bit area 230 is used for storing user data and system management data (e.g., the address mapping relation, etc.), and the error-correction code bit area 240 is used for storing ECC codes corresponding to the data. In the exemplary embodiment, several physical programming units together constitute a physical erasing unit, and the physical programming units belonging to the same physical erasing unit may be individually written but simultaneously erased. That is, the physical erasing unit is the smallest unit for erasing data. Namely, each of the physical erasing units contains the least number of memory cells that are erased all together. The physical programming unit is the smallest unit for programming data. Namely, each of the physical programming units is the smallest unit for writing data. According to an exemplary embodiment of the invention, the physical erasing units are physical blocks, and the physical programming units are physical pages or physical sectors, which should however not be construed as limitations to the invention.

Figure 3:
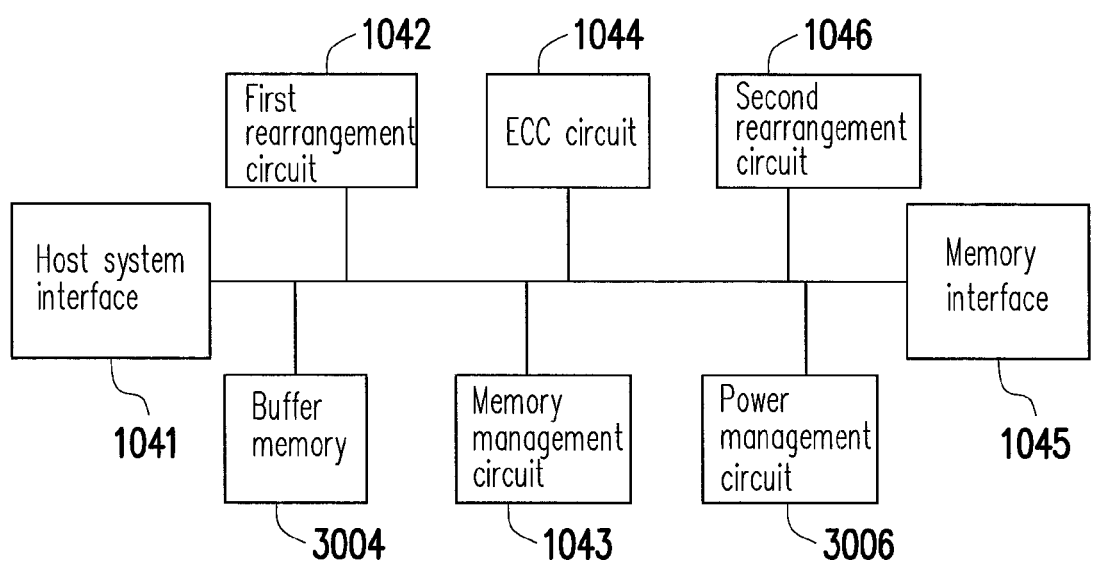
FIG. 3 is a schematic block diagram illustrating a memory controller according to an exemplary embodiment of the invention.

FIG. 3 is a schematic block diagram illustrating a memory controller according to an exemplary embodiment of the invention. With reference to FIG. 3, the memory controller 104 includes a host system interface 1041, a first rearrangement circuit 1042, a memory management circuit 1043, an ECC circuit 1044, a memory interface 1045, and a second rearrangement circuit 1046.

The host system interface 1041 is electrically connected to the memory management circuit 1043 and electrically connected to the host system 1000 via the connector 102. Here, the host system interface 1041 is used to receive and recognize the commands and data transmitted from the host system 1000. Accordingly, the commands and data from the host system 1000 are transmitted to the memory management circuit 1043 through the host system interface 1041. In the present embodiment, the host system interface 1041 corresponds to the connector 102 and is a SATA interface. However, in other exemplary embodiments, the host system interface 1041 may also be a USB interface, an MMC interface, a PATA interface, an IEEE 1394 interface, a PCI Express interface, an SD interface, an MS interface, a CF interface, an IDE interface, or any other standardized interface.

The memory management circuit 1043 is configured for controlling the overall operation of the memory controller 104. To be specific, the memory management circuit 1043 has a plurality of control commands, and when the memory storage device 100 is powered on, the control commands are executed to write data into or read data from the rewritable non-volatile memory module 106.

In an exemplary embodiment, the control commands of the memory management circuit 1043 are implemented in a firmware form. For instance, the memory management circuit 1043 has a micro-processor unit (not shown) and a read-only memory (not shown), and these control commands are burned in the read-only memory. When the memory storage device 100 is powered on, these control commands are executed by the micro-processor unit to implement the data access mechanism on the rewritable non-volatile memory module 106.

In another exemplary embodiment of the invention, the control commands of the memory management circuit 1043 may also be stored in a specific area of the rewritable non-volatile memory module 106 (for example, a system area exclusively used for storing system data in the rewritable non-volatile memory module 106) as program codes. Additionally, the memory management circuit 1043 may have a micro-processor unit (not shown), a read-only memory (not shown) and a random access memory (not shown). In particular, the read-only memory has boot codes, and when the memory controller 104 is enabled, the micro-processor unit first executes the boot codes to load the control commands stored in the rewritable non-volatile memory module 106 into the random access memory of the memory management circuit 1043. The micro-processor unit then executes said control commands to implement the data access mechanism on the rewritable non-volatile memory module 106.

Moreover, the control commands of the memory management circuit 1043 may also be implemented in a hardware form according to another exemplary embodiment of the invention. For instance, the memory management circuit 1043 includes a microcontroller, a memory management unit, a memory writing unit, a memory reading unit, a memory erasing unit, and a data processing unit. The memory management unit, the memory writing unit, the memory reading unit, the memory erasing unit, and the data processing unit are electrically connected to the microcontroller. The memory management unit is configured for managing the physical erasing units of the rewritable non-volatile memory module 106. The memory writing unit is configured for issuing a write command to the rewritable non-volatile memory module 106, so as to write data into the rewritable non-volatile memory module 106. The memory reading unit is configured for issuing a read command to the rewritable non-volatile memory module 106, so as to read data from the rewritable non-volatile memory module 106. The memory erasing unit is configured for issuing an erase command to the rewritable non-volatile memory module 106, so as to erase data from the rewritable non-volatile memory module 106. The data processing unit is configured for processing both the data to be written into the rewritable non-volatile memory module 106 and the data to be read from the rewritable non-volatile memory module 106.

The memory interface 1045 is electrically connected to the memory management circuit 1043, such that the memory controller 104 may be electrically connected to the rewritable non-volatile memory module 106. Accordingly, the memory controller 104 may execute related operations on the rewritable non-volatile memory module 106. Namely, data to be written into the rewritable non-volatile memory module 106 is converted by the memory interface 1045 into a format acceptable to the rewritable non-volatile memory module 106.

The first rearrangement circuit 1042, the second rearrangement circuit 1046, and the ECC circuit 1044 are electrically connected to the memory management circuit 1043, respectively. The ECC circuit 1044 is electrically connected to the first rearrangement circuit 1042 and the second rearrangement circuit 1046, respectively. Here, the first rearrangement circuit 1042 is configured to rearrange, edit, or disarrange the data from the host system 1000 according to a first rearrangement rule. The ECC circuit 1044 is configured to perform an error-correction encoding procedure and an error-correction encoding decoding procedure corresponding to each other, so as to ensure the correctness of data. The second rearrangement circuit 1046 is configured to rearrange, edit, or disarrange the ECC code generated by the ECC circuit 1044 according to a second rearrangement rule. The detailed operations of the first rearrangement circuit 1042, the second rearrangement circuit 1046, and the ECC circuit 1044 will be further explained hereinafter with reference to the drawings.

In another exemplary embodiment of the invention, the memory controller 104 further includes a buffer memory 3004. The buffer memory 3004 may be a static random access memory (SRAM), a dynamic random access memory (DRAM), or any other suitable random access memory, which should not be construed as a limitation to the invention. Here, the buffer memory 3004 is electrically connected to the memory management circuit 1043 and configured to temporarily store data and commands received from the host system 1000 or data received from the rewritable non-volatile memory module 106.

In another exemplary embodiment of the invention, the memory controller 104 further includes a power management circuit 3006. The power management circuit 3006 is electrically connected to the memory management circuit 1043 and configured to control the power supply of the memory storage device 100.

Figure 4:
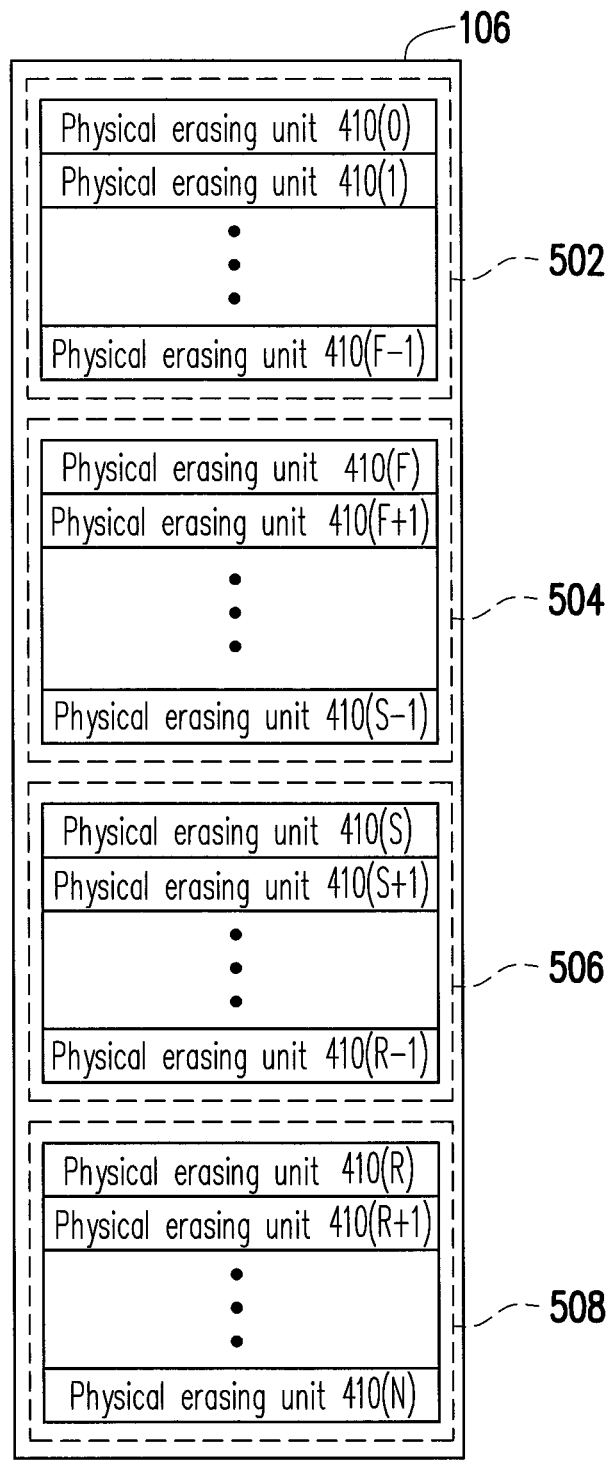
FIG. 4 and FIG. 5 are schematic diagrams illustrating management of a rewritable non-volatile memory module according to an exemplary embodiment of the invention.
Figure 5:
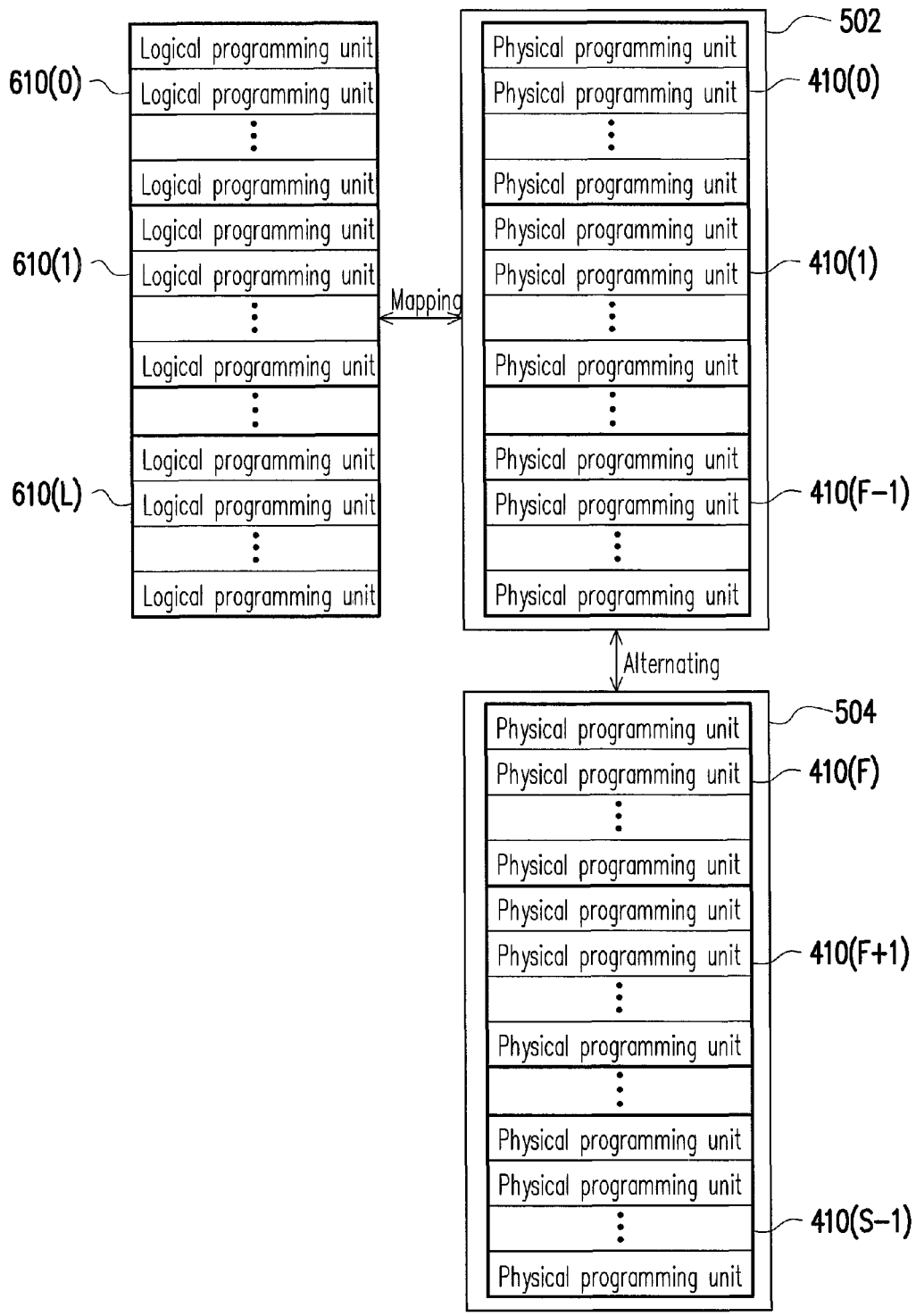

FIG. 4 and FIG. 5 are schematic diagrams illustrating management of a rewritable non-volatile memory module according to an exemplary embodiment of the invention.

It should be understood that the terms used herein for describing the operations (such as "get", "exchange", "group", and "alternate") performed on the physical erasing units of the rewritable non-volatile memory module 106 refer to logical operations performed on these physical erasing units. Namely, the physical erasing units in the rewritable non-volatile memory module 106 are only logically operated and the actual positions of the physical erasing units are not changed.

With reference to FIG. 4, in this present exemplary embodiment, the rewritable non-volatile memory module 106 includes physical erasing units 410(0)~410(N). The memory management circuit 1043 of the memory controller 104 logically groups the physical erasing units 410(0)~410(N) into a data area 502, a spare area 504, a system area 506, and a replacement area 508. The reference letters F, S, R, and N shown in FIG. 4 are positive integers which represent a number of the physical erasing units allocated in each area and may be determined according to a capacity of the memory storage device 100 used by the manufacturer of the memory storage device 100.

The physical erasing units logically belonging to the data area 502 and the spare area 504 are used for storing data from the host system 1000. For instance, the physical erasing units belonging to the data area 502 are already used for storing data, and the physical erasing units belonging to the spare area 504 are used for writing new data. Hence, the physical erasing units in the spare area 504 are either blank or available units (i.e., no data is recorded in these units or data recorded in these units is marked as invalid data). When the write commands and the data to be written are received from the host system 1000, the memory management circuit 1043 gets physical erasing units from the spare area 504 and writes the data into the gotten physical erasing units for substituting the physical erasing units of the data area 502. Alternatively, when it is necessary to perform data merge operations on a logical erasing unit, the memory management circuit 1043 gets the physical erasing units from the spare area 504 and writes data into the gotten physical erasing units, so as to replace the physical erasing units originally mapping to the logical erasing unit.

The physical erasing units logically belonging to the system area 506 are used for recording system data. For instance, the system data includes the manufacturers and models of the rewritable non-volatile memory module 106, the number of physical erasing units in the rewritable non-volatile memory module 106, the number of physical programming units in each physical erasing unit, and so on.

The physical erasing units logically belonging to the replacement area 508 are used for replacing damaged physical erasing units if any physical erasing unit belonging to the data area 502, the spare area 504, or the system area 506 is damaged. Particularly, during operation of the memory storage device 100, if there are still normal physical erasing units in the replacement area 508, and a physical erasing unit in the data area 502 is damaged, the memory management circuit 1043 gets a normal physical erasing unit from the replacement area 508 to replace the damaged physical erasing unit in the data area 502. If there is no more normal physical erasing unit in the replacement area 508, and a physical erasing unit is damaged, the memory management circuit 1043 announces that the entire memory storage device 100 is in a write-protect mode, and thus no more data may be written into the memory storage device 100.

Based on the above, during the operation of the memory storage device 100, the physical erasing units associated with the data area 502, the spare area 504, the system area 506, and the replacement area 508 are dynamically changed. For instance, the physical erasing units used for alternatively storing data are dynamically associated with the data area 502 or the spare area 504.

With reference to FIG. 5, the memory management circuit 1043 configures a plurality of logical erasing units 610(0) to 610(L) for mapping to the physical erasing units 410(0) to 410(F−1) in the data area 502, so that the host system 1000 may access the rewritable non-volatile memory module 106. Here, each of the logical erasing units 610(0) to 610(L) includes a plurality of logical programming units, and the logical programming units in the logical erasing units 610(0) to 610(L) are mapped to the physical programming units in the physical erasing units 410(0) to 410(F−1).

Specifically, the memory management circuit 1403 provides the configured logical erasing units 610(0) to 610(L) to the host system 1000 and maintains a logical address-physical address mapping table for recording the mapping relation of the logical erasing units 610(0) to 610(L) and the physical erasing units 410(0) to 410(F−1). Hence, when the host system 1000 intends to access a logical address, the memory management circuit 1043 confirms the logical erasing units and logical programming units that are corresponding to the logical address, and searches a physical programming unit mapped thereto through the logical address-physical address mapping table for performing the access operation.

In order to ensure the correctness of the data for improving reliability of the memory storage device 100, when the memory management circuit 1043 receives the write command from the host system 1000, the data to be written by the host system 1000 is specifically processed by the first rearrangement circuit 1042, the second rearrangement circuit 1046, and the ECC circuit 1044 at first. The memory management circuit 1043 then writes the processed data into the rewritable non-volatile memory module 106. When the host system 1000 intends to read the aforesaid data, the second rearrangement circuit 1046 and the ECC circuit 1044 inspect the correctness of the data. If the data passes the inspection, the memory management circuit 1043 transmits the data restored by the first rearrangement circuit 1042 to the host system 1000.

In order to clearly describe the invention, the written data corresponding to the write command of the host system 1000 is referred to as the original written data stream. When the memory management circuit 1043 receives the original written data stream, the first rearrangement circuit 1042 converts the original written data stream into a first data stream according to the first rearrangement rule. According to the first rearrangement rule, the data sequence is adjusted randomly or based on an algorithm. That is, the first rearrangement circuit 1042 randomly or regularly adjusts the sequence or the pattern of the data in each bit of the original written data stream and thereby generates the first data stream. Since the first data stream is already processed by the first rearrangement circuit 1042, the first data stream is different from the original written data stream.

The ECC circuit 1044 then performs an error-correction encoding procedure on the first data stream to generate an original ECC code corresponding to the first data stream. In the present exemplary embodiment, the error-correction encoding procedure refers to a Bose-Chaudhuri-Hocquenghem (BCH) algorithm, a low-density parity-check (LDPC) algorithm, a Hamming algorithm, or a Reed-Solomon algorithm, which should however not be construed as a limitation to the invention.

The second rearrangement circuit 106 then converts the original ECC code into a second ECC code according to a second rearrangement rule, and the original ECC code is different from the second ECC code after conversion. Note that the second rearrangement rule is different from the first rearrangement rule. Namely, in the exemplary embodiment of the invention, the original written data stream from the host system 1000 and the corresponding original ECC code are respectively disarranged by the first rearrangement circuit 1042 and the second rearrangement circuit 1046 according to different rules and then become two individual disordered data. It should be mentioned that the second rearrangement circuit 1046 in the present exemplary embodiment merely serves to rearrange the ECC code instead of rearranging and processing the system management data relevant to the written data. However, in another exemplary embodiment, the second rearrangement circuit 1046 may also rearrange and process the system management data relevant to the written data.

Several embodiments are exemplified hereinafter to elaborate how the second rearrangement circuit 1046 generates the second ECC code.

Figure 6A:
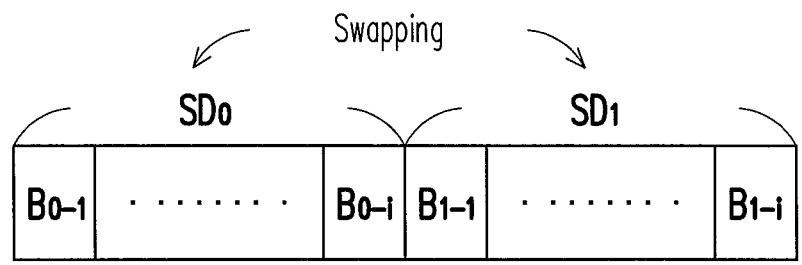
FIG. 6A and FIG. 6B are schematic diagrams illustrating conversion of an original error checking and correcting (ECC) code into a second ECC code according to an exemplary embodiment of the invention.
Figure 6B:
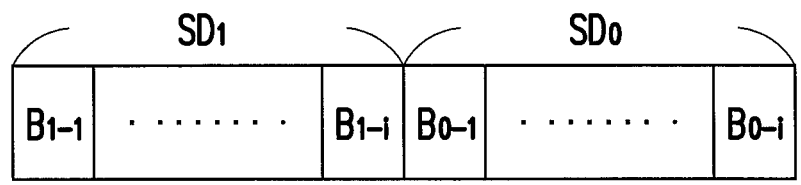

With reference to FIG. 6A, in the present exemplary embodiment, the original ECC code is assumed to include 2i bits, wherein i is a positive integer, and the data in each bit are referred to as $B_{0-1}$ to $B_{0-1}$ and $B_{1-1}$ to $B_{1-i}$. The second rearrangement circuit 1046, based on a preset data unit, divides the original ECC code into a plurality of sub-data, and the capacity of the preset data unit is i bits. As shown in FIG. 6A, the original ECC code is divided into two sub-data, i.e., sub-data, $SD_0$ and $SD_1$. Among all the sub-data, the second rearrangement circuit 1046 groups at least two of the sub-data as a set and swaps the sub-data belonging to the same set, so as to generate the second ECC code. As shown in FIG. 6A, the second rearrangement circuit 1046 swaps the sub-data $SD_0$ and $SD_1$ to generate the second ECC code illustrated in FIG. 6B. It can be learned from FIG. 6A and FIG. 6B that the sub-data acts as a unit for the swapping operation, and the order of data in each bit of the sub-data remains unchanged. For instance, regarding to the i bits included in the sub-data $SD_0$, the order of data $B_{0-1}$ to $B_{0-i}$ stays the same before and after the second rearrangement circuit 1046 processes the data (i.e., the data $B_{0-1}$ is in the leftmost bit of the sub-data $SD_0$, and the data $B_{0-i}$ is in the rightmost bit of the sub-data $SD_0$).

Two exemplary embodiments are provided hereinafter with reference to FIG. 7A to FIG. 7D and FIG. 8A to FIG. 8C for elaborating how the second rearrangement circuit 1046 generates the second ECC code by means of the sub-data as a swapping unit.

With reference to FIG. 7A to FIG. 7D, in the present exemplary embodiment, the original ECC code includes 16 bits, and the data in each bit are referred to as $B_0$ to $B_{15}$. Given that the preset data unit is 1 bit, the second rearrangement circuit 1046 divides the original ECC code into 16 sub-data $SD_0$ to $SD_{15}$. Namely, the data in each bit represents one sub-data.

Figure 7A:
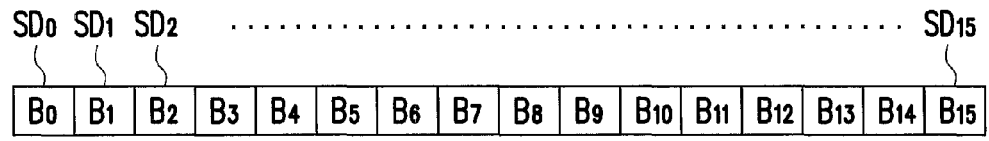
FIG. 7A, FIG. 7B, FIG. 7C, and FIG. 7D are schematic diagrams illustrating conversion of an original ECC code into a second ECC code according to another exemplary embodiment of the invention.
Figure 7B:
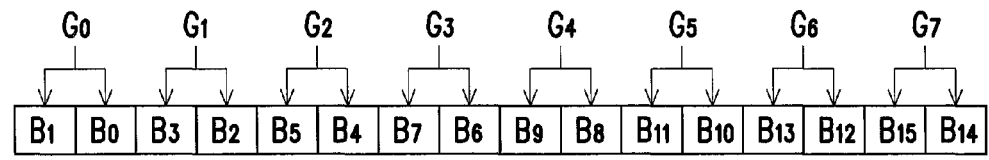
Figure 7C:
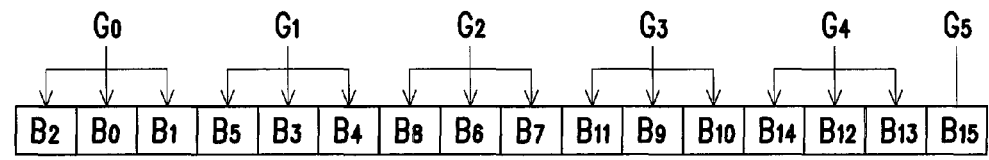

If the second rearrangement circuit 1046 groups two sub-data as a set, the sub-data $SD_0$ to $SD_{15}$ shown in FIG. 7A are grouped into 8 sets. The sub-data belonging to the same set are swapped to generate the second ECC code, as shown in FIG. 7B. For instance, after the second rearrangement circuit 1046 processes the data, the two sub-data $SD_0$ and $SD_1$ (i.e., the data $B_0$ and $B_1$) included by the sub-data set $G_0$ are swapped, and therefore the locations of the two sub-data $SD_0$ and $SD_1$ are different from the locations of the two sub-data $SD_0$ and $SD_1$ in the original ECC code. By the same token, the two sub-data $SD_2$ and $SD_3$ (i.e., the data $B_2$ and $B_3$) included by the sub-data set $G_1$ are swapped as well, and therefore the locations of the two sub-data $SD_2$ and $SD_3$ are different from the locations of the two sub-data $SD_2$ and $SD_3$ in the original ECC code.

If the second rearrangement circuit 1046 groups three sub-data as a set, the sub-data $SD_0$ to $SD_{15}$ shown in FIG. 7A are grouped into 6 sets, wherein five of the sub-data sets individually include three sub-data, and the last sub-data set merely includes one sub-data. The second rearrangement circuit 1046 swaps the sub-data belonging to the same set to generate the second ECC code illustrated in FIG. 7C. For instance, the three sub-data $SD_0$, $SD_1$, and $SD_2$ (i.e., the data $B_0$, $B_1$, and $B_2$) in the sub-data set $G_0$ are swapped by the second rearrangement circuit 1046. As to the sub-data set $G_5$ that merely includes one sub-data, there is no other sub-data belonging to the same set as the sub-data $SD_{15}$ (i.e., the data $B_{15}$), the location of the data $B_{15}$ remains unchanged in the present exemplary embodiment.

Figure 7D:
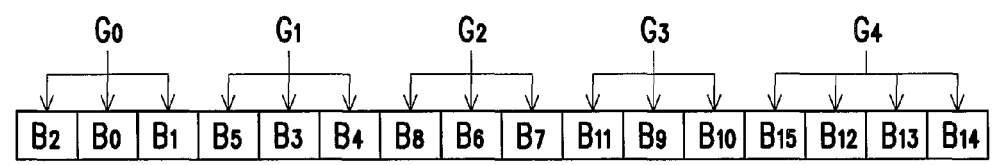

However, in another exemplary embodiment, the unaccompanied sub-data is merged into another sub-data set and is then swapped with other sub-data in the sub-data set. As shown in FIG. 7D, the sub-data set $G_4$ in the present exemplary embodiment includes four sub-data $SD_{12}$, $SD_{13}$, $SD_{14}$, and $SD_{15}$ (i.e., the data $B_{12}$, $B_{13}$, $B_{14}$, and $B_{15}$) that are swapped, and therefore the locations of the four sub-data $SD_{12}$, $SD_{13}$, $SD_{14}$, and $SD_{15}$ are different from the locations of the four sub-data $SD_{12}$, $SD_{13}$, $SD_{14}$, and $SD_{15}$ in the original ECC code.

Figure 8A:
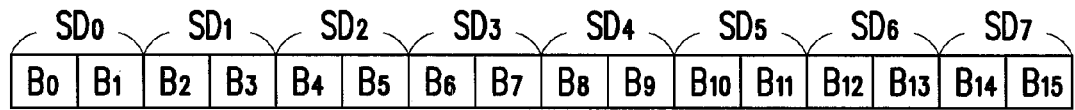
FIG. 8A, FIG. 8B, and FIG. 8C are schematic diagrams illustrating conversion of an original ECC code into a second ECC code according to yet another exemplary embodiment of the invention.
Figure 8B:
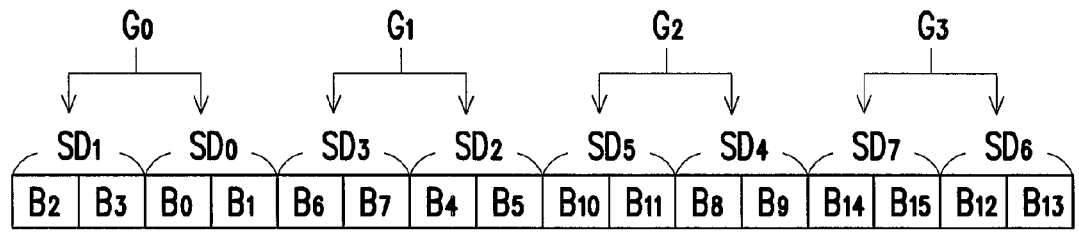
Figure 8C:
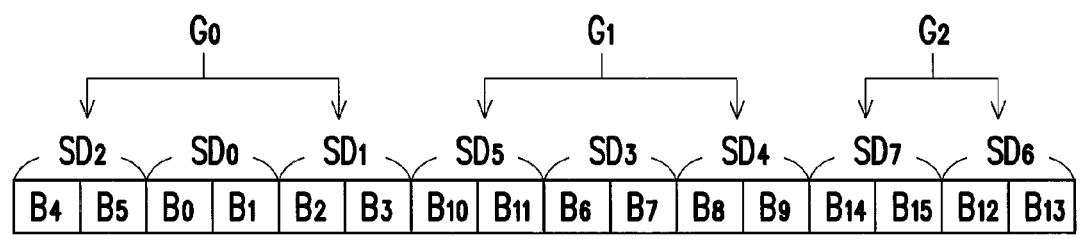

According to the exemplary embodiment illustrated in FIG. 8A to FIG. 8C, the original ECC code includes 16 bits, and the data in each bit are referred to as $B_0$ to $B_{15}$. Given that the preset data unit is 2 bits, the second rearrangement circuit 1046 divides the original ECC code into 8 sub-data $SD_0$ to $SD_7$, as shown in FIG. 8A.

If the second rearrangement circuit 1046 groups two sub-data as one set, the resultant second ECC code is as illustrated in FIG. 8B. It can be learned from FIG. 8A and FIG. 8B that the sub-data $SD_0$ and $SD_1$ belonging to the same sub-data set $G_0$ are swapped; nonetheless, in the exemplary sub-data $SD_0$, the locations of the data $B_0$ and $B_1$ in two bits remain unchanged after the second rearrangement circuit 1046 processes the data (i.e. the data $B_0$ is in the left bit, and the data $B_1$ is in the right bit).

If the second rearrangement circuit 1046 groups three sub-data as one set, the resultant second ECC code is as illustrated in FIG. 8C. In the exemplary sub-data set $G_0$, the sub-data $SD_0$ to $SD_2$ are swapped, while the locations of the data in all bits of each sub-data stay unchanged.

Note that the second rearrangement circuit 1046 in the previous exemplary embodiment swaps the sub-data belonging to the same set by means of the sub-data as a swapping unit, whereas the way to swap the sub-data belonging to the same set is not limited in the invention. For instance, the sub-data belonging to the same set may be swapped with each other or may be moved toward a specific direction by means of the sub-data as a unit of movement. People having ordinary skill in the art may be able to easily swap, exchange, or rearrange the sub-data in a different manner without departing from the spirit of the invention.

Figure 9A:
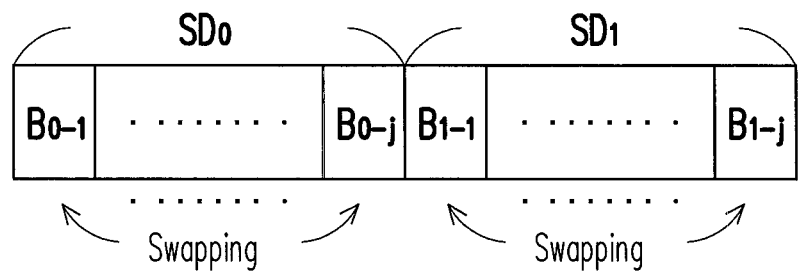
FIG. 9A and FIG. 9B are schematic diagrams illustrating conversion of an original ECC code into a second ECC code according to yet another exemplary embodiment of the invention.
Figure 9B:
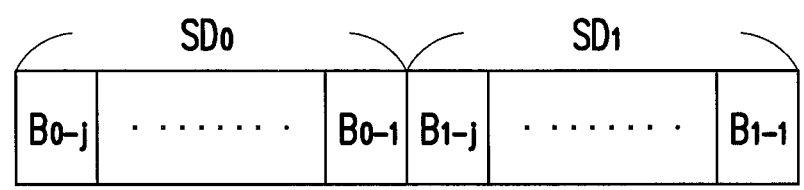

With reference to FIG. 9A, in the present exemplary embodiment, the original ECC code is assumed to include 2j bits, wherein j is a positive integer greater than 1, and the data in each bit are referred to as $B_{0-1}$ to $B_{0-j}$ and $B_{1-1}$ to $B_{1-j}$. The second rearrangement circuit 1046, based on a preset data unit, divides the original ECC code into a plurality of sub-data, and the capacity of the preset data unit is j bits. As shown in FIG. 9A, the second rearrangement circuit 1046 divides the original ECC code into two sub-data, i.e., sub-data, $SD_0$ and $SD_1$, and the second rearrangement circuit 1046 respectively swaps the data in j bits of each sub-data to generate the second ECC code. In particular, as shown in FIG. 9B, the second rearrangement circuit 1046 maintains the relative positions of the sub-data $SD_0$ and $SD_1$, while the second rearrangement circuit 1046 swaps the data in all bits of each sub-data.

Figure 10A:
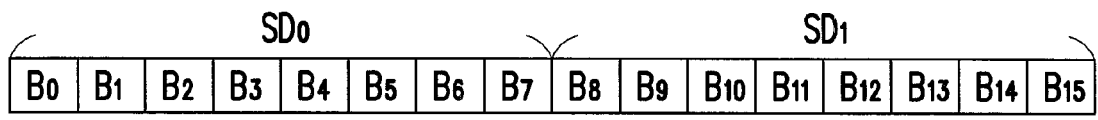
FIG. 10A and FIG. 10B are schematic diagrams illustrating conversion of an original ECC code into a second ECC code according to an exemplary embodiment of the invention.
Figure 10B:
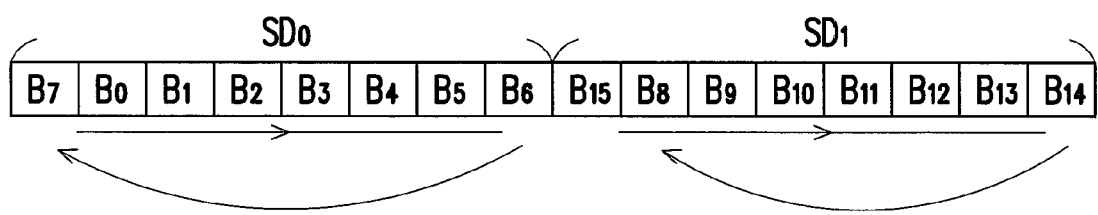
Figure 11:
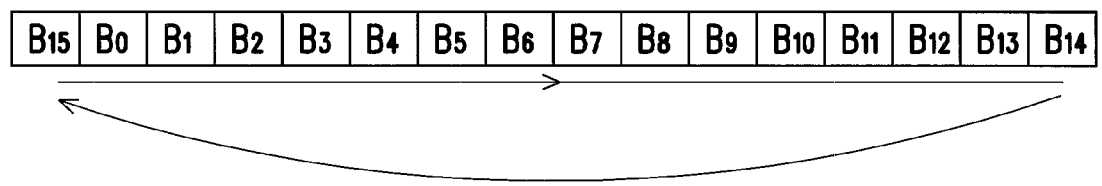
FIG. 11 is a schematic diagram illustrating a second ECC code according to an exemplary embodiment of the invention.

With reference to FIG. 10A and FIG. 10B, in the present exemplary embodiment, the original ECC code includes 16 bits, and the data in each bit are referred to as $B_0$ to $B_{15}$. Given that the preset data unit is 8 bits, the second rearrangement circuit 1046 divides the original ECC code into 2 sub-data $SD_0$ to $SD_1$. Namely, the capacity of each sub-data is one byte.

In process of generating the second ECC code, as shown in FIG. 10B, the second rearrangement circuit 1046 swaps the data in all 8 bits of the sub-data $SD_0$ through rotating the data by 1 bit toward the right. The second rearrangement circuit 1046 also swaps the data in all 8 bits of the sub-data $SD_1$ through rotating the data by 1 bit toward the right, for instance. Note that the way to swap the data in each bit of the sub-data is not limited in the invention. People having ordinary skill in the art may be able to easily swap, exchange, or rearrange the data in a different manner without departing from the spirit of the invention.

According to another exemplary embodiment, the second rearrangement circuit 1046 does not divide the original ECC code into a plurality of sub-data but rotates the original ECC code by k bits in a specific direction to generate the second ECC code. Here, k is a positive integer, and the specific direction may be a direction toward the left or the right, for instance. In another exemplary embodiment, the second rearrangement circuit 1046, based on an algorithm, rearranges the original ECC code to generate the second ECC code through an algorithmic circuit, e.g., performs an XOR calculation on the original ECC code and a specific data to generate the second ECC code.

Thereafter, the memory management circuit 1043 looks up a logical address-physical address mapping table to find the physical programming unit (referred to as the specific physical programming unit hereinafter) mapped to the logical address in the write command, and the first data stream generated by the first rearrangement circuit 1042 and the second ECC code generated by the second rearrangement circuit 1046 are respectively written into a data bit area and an error-correction code bit area in the specific physical programming unit. In another exemplary embodiment, the memory management circuit 1043 may write the first data stream and the second ECC code respectively into the data bit area and the error-correction code bit area in different physical programming units, and the physical programming units where the first data stream and the second ECC code are written into may be recorded in a data and error-correction code correspondence table.

That is, when the data is to be written into the rewritable non-volatile memory module 106, the ECC circuit 1044 generates an original ECC code corresponding to the first data stream disarranged by the first rearrangement circuit 1042, and the original ECC code may be written into the rewritable non-volatile memory module 106 after the original ECC code is converted by the second rearrangement circuit 1046 into the second ECC code.

When the host system 1000 is to read the original written data stream, the memory management circuit 1043 respectively reads the first data stream and the second ECC code from the data bit area and the error-correction code bit area in the specific physical programming unit, or the memory management circuit 1043 respectively reads the first data stream and the second ECC code from different physical programming units with reference to the data and error-correction code correspondence table. The second rearrangement circuit 1046, according to the second rearrangement rule, re-converts the second ECC code into the original ECC code. The re-conversion is implemented according to the second rearrangement rule which is applied for generating the second ECC code. For instance, the sub-data belonging to the same set are swapped and re-converted into the original ECC code, the data in each bit of the same sub-data are swapped and re-converted into the original ECC code, the second ECC code is rotated by k bits in a direction opposite to the specific direction to re-convert the second ECC code into the original ECC code, or the second ECC code is rearranged through performing an algorithm to re-convert the second ECC code into the original ECC code.

The ECC circuit 1044 then performs an error-correction decoding procedure on the first data stream according to the original ECC code re-converted by the second rearrangement circuit 1046, so as to recognize whether the first data stream has an uncorrectable error bit.

Specifically, when the memory management circuit 1043 reads the data, due to the data shift that results from interfering the read signals, the second rearrangement circuit 1046 may not be able to re-convert the second ECC code (read from the error-correction code bit area) into the original ECC code generated by the ECC circuit 1044 at the time the data is written. Hence, the ECC circuit 1044 may detect the uncorrectable error bit when performing the error-correction decoding procedure.

In addition, if the host system 1000 is to read the data which is already erased (i.e., the data of the specific physical programming unit is erased to be the 0 xFF data), it is unlikely to make erroneous detection of the uncorrectable error bit because the error-correction code bit area records 0xFF data even after the re-conversion operation of the second rearrangement circuit 1046.

Figure 12:
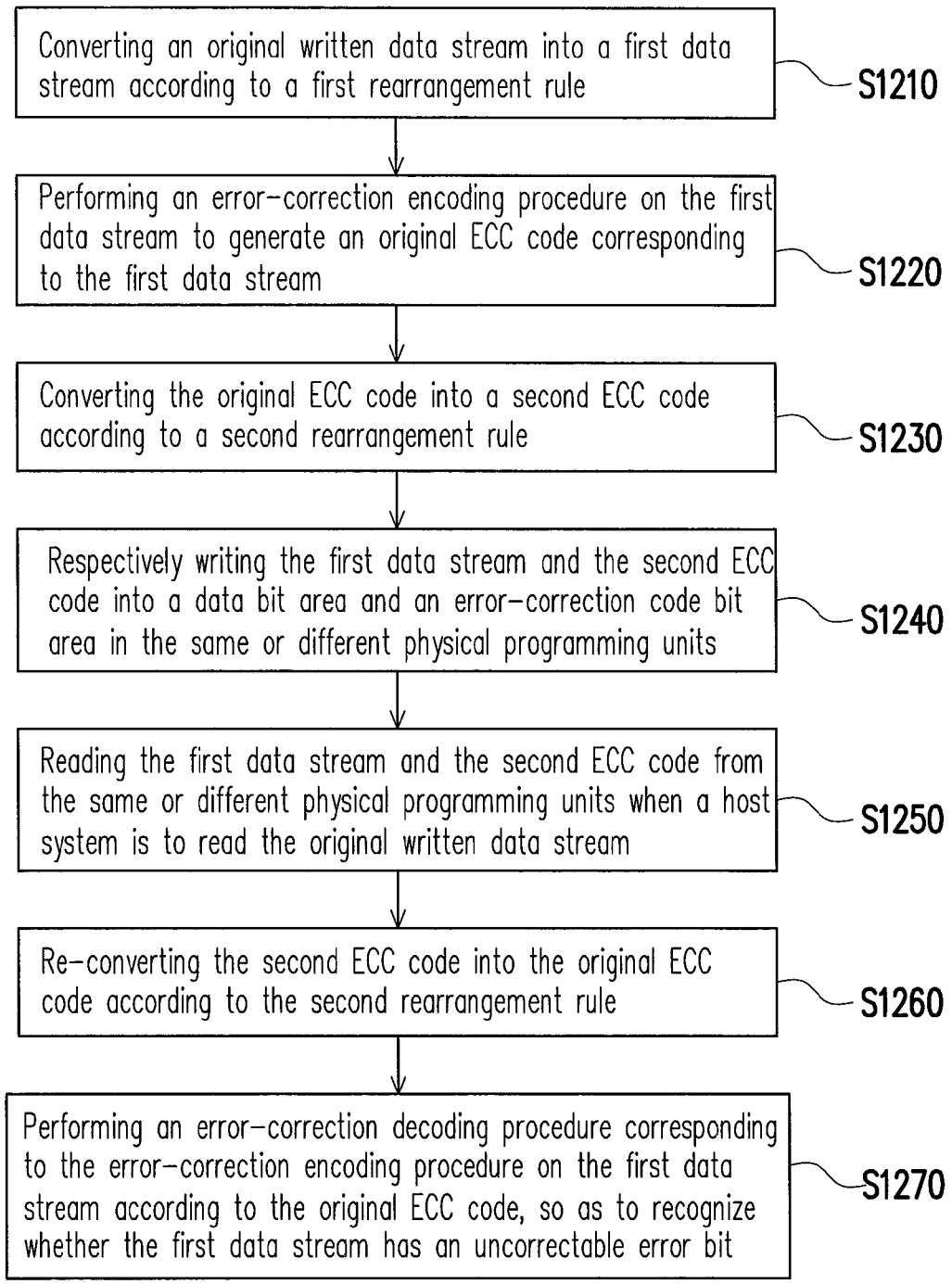
FIG. 12 is a flowchart illustrating a data processing method according to an exemplary embodiment of the invention.

FIG. 12 is a flowchart illustrating a data processing method according to an exemplary embodiment of the invention.

When an original written data stream is received from a host system 1000, as shown in step S1210, a first rearrangement circuit 1042 converts the original written data stream into a first data stream according to a first rearrangement rule.

In step S1220, an ECC circuit 1044 performs an error-correction encoding procedure on the first data stream to generate an original ECC code corresponding to the first data stream.

In step S1230, a second rearrangement circuit 1046, according to a second rearrangement rule, converts the original ECC code into a second ECC code. Here, the first rearrangement rule is different from the second data arrangement rule.

In step S1240, a memory management circuit 1043 respectively writes the first data stream and the second ECC code into a data bit area and an error-correction code bit area in the same or different physical programming units in a rewritable non-volatile memory module 106.

In step S1250, when the host system 1000 is to read the original written data stream that is written into the rewritable non-volatile memory module 106, the memory management circuit 1043 reads the first data stream and the second ECC code from the same or different physical programming units.

In step S1260, the second rearrangement circuit 1046, according to the second rearrangement rule, re-converts the second ECC code into the original ECC code.

In step S1270, the ECC circuit 1044 is configured to recognize whether the first data stream has an uncorrectable error bit by performing an error-correction decoding procedure corresponding to the error-correction encoding procedure on the first data stream according to the original ECC code.

Figure 13:
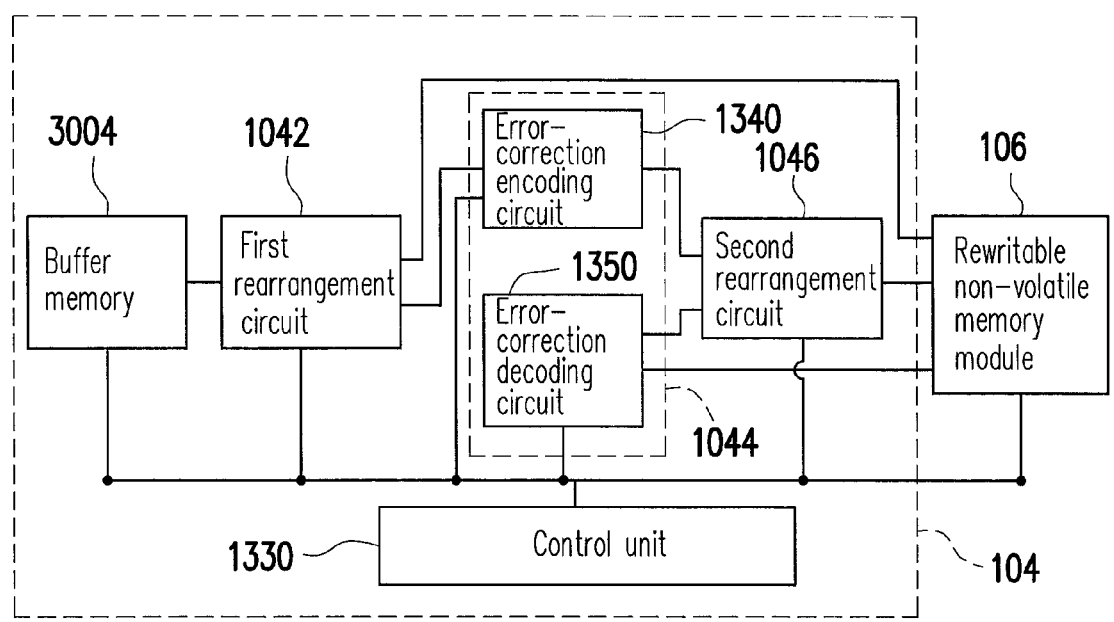
FIG. 13 is a schematic diagram illustrating a memory controller according to another exemplary embodiment of the invention.

FIG. 13 is a schematic diagram illustrating a memory controller according to an exemplary embodiment of the invention. With reference to FIG. 13, the memory controller 104 includes a buffer memory 3004, an error-correction encoding circuit 1340, a first rearrangement circuit 1042, a second rearrangement circuit 1046, an error-correction decoding circuit 1350, and a control unit 1330. The control unit 1330 may be a control chip that is electrically connected to the buffer memory 3004, the error-correction encoding circuit 1340, the first rearrangement circuit 1042, the second rearrangement circuit 1046, the error-correction decoding circuit 1046, and the rewritable non-volatile memory module 106.

The first rearrangement circuit 1042 is electrically connected to the buffer memory 3004, the error-correction encoding circuit 1340, and a rewritable non-volatile memory module 106. The second rearrangement circuit 1046 is electrically connected to the error-correction encoding circuit 1340 and the rewritable non-volatile memory module 106. The error-correction decoding circuit 1350 is electrically connected to the second rearrangement circuit 1046 and the rewritable non-volatile memory module 106.

In the present exemplary embodiment, the error-correction encoding circuit 1340 and the error-correction decoding circuit 1350 may achieve parts of or all of the functions of the ECC circuit 1044 shown in FIG. 3. Her, the error-correction encoding circuit 1340 serves to perform an error-correction encoding procedure, while the error-correction decoding circuit 1350 serves to perform an error-correction decoding procedure. The buffer memory 3004, the first rearrangement circuit 1042, and the second rearrangement circuit 1046 described in the present exemplary embodiment may have identical or similar functions as those of the components with the same reference numbers in FIG. 3.

When the host system 1000 is to write data, the original written data stream is temporarily stored in the buffer memory 3004 and then transmitted to the first rearrangement circuit 1042, so as to convert the original written data stream into the first data stream. The first data stream is not only transmitted to the rewritable non-volatile memory module 106 for storage but also transmitted to the error-correction encoding circuit 1340 for generating the corresponding original ECC code. The second rearrangement circuit 1046 then converts the original ECC code into the second ECC code and then transmits the second ECC code to the rewritable non-volatile memory module 106 for storage.

When the host system 1000 is to read the written data, the first data stream read from the rewritable non-volatile memory module 106 is transmitted to the first rearrangement circuit 1042, so as to re-convert the first data stream into the original written data stream. Besides, the first data stream read from the rewritable non-volatile memory module 106 is also transmitted to the error-correction decoding circuit 1350, and the second ECC code corresponding to the first data stream is transmitted to the second rearrangement circuit 1046, so as to re-convert the second ECC code into the original ECC code. The re-converted original ECC code is then transmitted to the error-correction decoding circuit 1350. Thereby, the error-correction decoding circuit 1350 may determine whether the first data stream has an uncorrectable error bit according to the original ECC code. If any uncorrectable error bit is detected, a repair circuit (not shown) is applied to repair the original written data stream re-converted by the first rearrangement circuit 1042. The original written data stream that contains no error bit or is already repaired is temporarily stored in the buffer memory 3004 and then transmitted back to the host system 1000.

According to the previous exemplary embodiments, note that the original written data stream from the host system 1000 is first processed by the first rearrangement circuit 1042 and converted to the first data stream. Thereafter, the ECC circuit 1044 generates the original ECC code corresponding to the first data stream. However, the invention is not limited thereto. In another exemplary embodiment, when the host system 1000 intends to write the original written data stream into the rewritable non-volatile memory module 106, the original written data stream is not processed by the first rearrangement circuit 1042 and is directly transmitted to the ECC circuit 1044 for generating the original ECC code. That is, the original written data stream in the present exemplary embodiment refers to the first data stream. The second rearrangement circuit 1046 then converts the original ECC code into the second ECC code, and the memory management circuit 1043 respectively writes the original written data stream and the second ECC code into the data bit area and the error-correction code bit area in the same or different physical programming units in the rewritable non-volatile memory module 106. When the host system 1000 intends to read the original written data stream, the memory management circuit 1043 reads the original written data stream and the second ECC code from the rewritable non-volatile memory module 106, the second rearrangement circuit 1046 re-converts the second ECC code into the original ECC code, and the ECC circuit 1044 performs the error-correction decoding procedure on the original written data stream according to the original ECC code, so as to recognize whether the original written data stream has an uncorrectable error bit.

To sum up, according to the memory storage device, the memory controller, and the data processing method described herein, the ECC code corresponding to the data to be written is rearranged. Accordingly, when the rearranged data is to be read, the rearranged ECC code may be applied to recognize whether an uncorrectable error bit exists in the data. As such, even though data shift occurs in process of reading the data, whether the data has the uncorrectable error bit may be accurately detected, which enhance reliability of the memory storage device. However, the advantages aforementioned are not required in all versions of the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method for processing data for a rewritable non-volatile memory module, wherein the rewritable non-volatile memory module has a plurality of physical programming units, and each of the physical programming units comprises a data bit area and an error-correction code bit area, the method comprising:
receiving a first data stream;
performing an error-correction encoding procedure on the first data stream to generate an original error checking and correcting (ECC) code corresponding to the first data stream, wherein the original ECC code is utilized for error-correction of data corresponding to the first data stream;
rearranging the original ECC code into a second ECC code according to a second rearrangement rule, wherein the original ECC code is different from the second ECC code, a bit number of the original ECC code is equal to the bit number of the second ECC code; and
respectively writing the first data stream and the second ECC code into one of the data bit areas and one of the error-correction code bit areas in the physical programming units.

2. The method as recited in claim 1, wherein the first data stream is obtained by converting an original written data stream from a host system according to a first rearrangement rule, the first data stream is different from the original written data stream, and the first rearrangement rule is different from the second rearrangement rule.

3. The method as recited in claim 2, further comprising:
respectively reading the first data stream and the second ECC code from one of the data bit areas and one of the error-correction code bit areas in the physical programming units when the host system is to read the original written data stream;
re-converting the second ECC code into the original ECC code according to the second rearrangement rule; and
recognizing whether the first data stream has an uncorrectable error bit by performing an error-conection decoding procedure corresponding to the error-correction encoding procedure on the first data stream according to the re-converted original ECC code.

4. The method as recited in claim 1, wherein the step of rearranging the original ECC code into the second ECC code according to the second rearrangement rule comprises:
dividing the original ECC code into a plurality of sub-data, wherein each of the sub-data has i bits, and i is a positive integer; and
among the sub-data, grouping at least two of the sub-data as a set and swapping the at least two of the sub-data belonging to the same set to generate the second ECC code.

5. The method as recited in claim 1, wherein the step of rearranging the original ECC code into the second ECC code according to the second rearrangement rule comprises:
dividing the original ECC code into a plurality of sub-data, wherein each of the sub-data has j bits, and j is a positive integer greater than 1; and
for each of the sub-data, swapping data in the j bits of the sub-data to generate the second ECC code.

6. The method as recited in claim 1, wherein the step of rearranging the original ECC code into the second ECC code according to the second rearrangement rule comprises:
rotating the original ECC code by k bits in a specific direction to generate the second ECC code, wherein k is a positive integer.

7. A memory controller configured to manage a rewritable non-volatile memory module, the memory controller comprising:
a host system interface configured to electrically connect a host system;
a memory interface configured to electrically connect the rewritable non-volatile memory module, wherein the rewritable non-volatile memory module has a plurality of physical programming units, and each of the physical programming units comprises a data bit area and an error-correction code bit area;
an ECC circuit configured to perform an error-correction encoding procedure and an error-correction decoding procedure corresponding to each other;
a second rearrangement circuit electrically connected to the ECC circuit; and
a memory management circuit electrically connected to the host system interface, the memory interface, the ECC circuit, and the second rearrangement circuit,
wherein the ECC circuit is configured to perform the error-correction encoding procedure on a first data stream to generate an original ECC code corresponding to the first data stream, wherein the original ECC code is utilized for error-correction of data corresponding to the first data stream,
wherein the second rearrangement circuit is configured to rearrange the original ECC code into a second ECC code according to a second rearrangement rule, and the original ECC code is different from the second ECC code, a bit number of the original ECC code is equal to the bit number of the second ECC code,
wherein the memory management circuit is configured to respectively write the first data stream and the second ECC code into one of the data bit areas and one of the error-correction code bit areas in the physical programming units.

8. The memory controller as recited in claim 7 further comprising:
a first rearrangement circuit electrically connected to the ECC circuit and the memory management circuit,
wherein when the memory controller receives an original written data stream from the host system through the host system interface, the first rearrangement circuit is configured to convert the original written data stream into the first data stream according to a first rearrangement rule, the first data stream is different from the original written data stream, and the first rearrangement rule is different from the second rearrangement rule.

9. The memory controller as recited in claim 8, wherein when the host system is to read the original written data stream, the memory management circuit is configured to respectively read the first data stream and the second ECC code from one of the data bit areas and one of the error-correction code bit areas in the physical programming units,
wherein the second rearrangement circuit is configured to re-convert the second ECC code into the original ECC code according to the second rearrangement rule,
wherein the ECC circuit is configured to recognize whether the first data stream has an uncorrectable error bit by performing the error-correction decoding procedure on the first data stream according to the re-converted original ECC code.

10. The memory controller as recited in claim 7, wherein the operation that the second rearrangement circuit is configured to rearrange the original ECC code into the second ECC code according to the second rearrangement rule comprises:
the second rearrangement circuit is configured to divide the original ECC code into a plurality of sub-data, group at least two of the sub-data as a set, and swap the at least two of the sub-data belonging to the same set to generate the second ECC code, wherein each of the sub-data has i bits, and i is a positive integer.

11. The memory controller as recited in claim 7, wherein the operation that the second rearrangement circuit is configured to rearrange the original ECC code into the second ECC code according to the second rearrangement rule comprises:
the second rearrangement circuit is configured to divide the original ECC code into a plurality of sub-data, each of the sub-data has j bits, and j is a positive integer greater than 1,
wherein for each of the sub-data, the second rearrangement circuit swaps data in the j bits of the sub-data to generate the second ECC code.

12. The memory controller as recited in claim 7, wherein the operation that the second rearrangement circuit is configured to rearrange the original ECC code into the second ECC code according to the second rearrangement rule comprises:
the second rearrangement circuit is configured to rotate the original ECC code by k bits in a specific direction to generate the second ECC code, and k is a positive integer.

13. A memory storage device comprising:
a rewritable non-volatile memory module having a plurality of physical programming units, each of the physical programming units comprising a data bit area and an error-correction code bit area;
a connector configured to electrically connect a host system; and
a memory controller electrically connected to the rewritable non-volatile memory module and the connector and configured to perform an error-correction encoding procedure on a first data stream to generate an original ECC code corresponding to the first data stream, wherein the original ECC code is utilized for error-correction of data corresponding to the first data stream,
wherein the memory controller is further configured to rearrange the original ECC code into a second ECC code according to a second rearrangement rule, and the original ECC code is different from the second ECC code, a bit number of the original ECC code is equal to the bit number of the second ECC code, wherein the memory controller is further configured to respectively write the first data stream and the second ECC code into one of the data bit areas and one of the error-correction code bit areas in the physical programming units.

14. The memory storage device as recited in claim 13, wherein when the memory controller receives an original written data stream from the host system through the connector, the memory controller converts the original written data stream into the first data stream according to a first rearrangement rule, the first data stream is different from the original written data stream, and the first rearrangement rule is different from the second rearrangement rule.

15. The memory storage device as recited in claim 13, wherein the operation that the memory controller is configured to rearrange the original ECC code into the second ECC code according to the second rearrangement rule comprises:
the memory controller is configured to divide the original ECC code into a plurality of sub-data, group at least two of the sub-data as a set, and swap the at least two of the sub-data belonging to the same set to generate the second ECC code, wherein each of the sub-data has i bits, and i is a positive integer.

16. The memory storage device as recited in claim 13, wherein the operation that the memory controller is configured to rearrange the original ECC code into the second ECC code according to the second rearrangement rule comprises:
the memory controller is configured to divide the original ECC code into a plurality of sub-data, each of the sub-data has j bits, and j is a positive integer greater than 1, wherein the memory controller is configured to swap data in the j bits of the sub-data to generate the second ECC code.

17. The memory storage device as recited in claim 13, wherein the operation that the memory controller is configured to rearrange the original ECC code into the second ECC code according to the second rearrangement rule comprises:
the memory controller is configured to rotate the original ECC code by k bits in a specific direction to generate the second ECC code, and k is a positive integer.

18. The memory storage device as recited in claim 13, wherein when the host system is to read the original written data stream, the memory controller is configured to respectively read the first data stream and the second ECC code from one of the data bit areas and one of the error-correction code bit areas in the physical programming units, re-convert the second ECC code into the original ECC code according to the second rearrangement rule, and recognizing whether the first data stream has an uncorrectable error bit by performing an error-correction decoding procedure corresponding to the error-correction encoding procedure on the first data stream according to the re-converted original ECC code.

19. A memory controller comprising:
a buffer memory;
an error-correction encoding circuit configured to perform an error-correction encoding procedure on a first data stream to generate an original ECC code corresponding to the first data stream;
a first rearrangement circuit electrically connected to the buffer memory, the error-correction encoding circuit, and a rewritable non-volatile memory module, wherein the first rearrangement circuit is configured to convert an original written data stream from the buffer memory into the first data stream according to a first rearrangement rule, and the first data stream is different from the original written data stream;
a second rearrangement circuit electrically connected to the error-correction encoding circuit and the rewritable non-volatile memory module, wherein the second rearrangement circuit is configured to convert the original ECC code from the error-correction encoding circuit into a second ECC code according to a second rearrangement rule and re-convert the second ECC code from the rewritable non-volatile memory module into the original ECC code, the second ECC code is different from the original ECC code, and the first rearrangement rule is different from the second rearrangement rule;
an error-correction decoding circuit electrically connected to the second rearrangement circuit and the rewritable non-volatile memory module, wherein the error-correction decoding circuit is configured to recognizing whether the first data stream has an uncorrectable error bit by performing an error-correction decoding procedure corresponding to the error-correction encoding procedure on the first data stream from the rewritable non-volatile memory module according to the original ECC code; and
a control unit electrically connected to the buffer memory, the error-correction encoding circuit, the first rearrangement circuit, the second rearrangement circuit, the error-correction decoding circuit, and the rewritable non-volatile memory module.

* * * * *